(12) United States Patent
Wu et al.

(10) Patent No.: US 10,674,646 B1
(45) Date of Patent: Jun. 2, 2020

(54) EMI SHIELD WITH INCREASED HEAT DISSIPATING EFFECT

(71) Applicant: Aliner Industries Inc., Taipei (TW)

(72) Inventors: Meng Chieh Wu, Taipei (TW); Yun Sheng Chen, Taipei (TW)

(73) Assignee: Aliner Industries Inc., Sinjhaung, Taipei (TW)

( * ) Notice: Subject to any disclaimer, the term of this patent is extended or adjusted under 35 U.S.C. 154(b) by 0 days.

(21) Appl. No.: 16/663,400

(22) Filed: Oct. 25, 2019

(51) Int. Cl.
*H05K 9/00* (2006.01)
*H05K 7/20* (2006.01)

(52) U.S. Cl.
CPC ....... *H05K 9/0007* (2013.01); *H05K 7/20418* (2013.01); *H05K 9/0024* (2013.01)

(58) Field of Classification Search
CPC .......... H05K 9/0024; H05K 7/20418
See application file for complete search history.

(56) References Cited

U.S. PATENT DOCUMENTS

| | | | |
|---|---|---|---|
| 6,744,640 B2 * | 6/2004 | Reis | H01L 23/552 361/818 |
| 6,985,366 B2 * | 1/2006 | Albayrak | H05K 9/0026 361/800 |
| 7,053,295 B2 * | 5/2006 | Murasawa | H01L 23/4006 174/358 |
| 7,245,896 B2 * | 7/2007 | Seo | H01Q 1/02 174/377 |
| 7,692,927 B2 * | 4/2010 | Jin | H01L 23/02 165/80.3 |
| 9,368,455 B2 | 6/2016 | Mahajan et al. | |
| 9,439,333 B2 * | 9/2016 | Daughtry, Jr. | H05K 9/0028 |
| 9,691,711 B2 | 6/2017 | Mahajan et al. | |
| 10,304,621 B2 | 5/2019 | Ansari et al. | |
| 10,321,553 B2 * | 6/2019 | Zhang | H05K 1/0203 |
| 10,410,948 B2 | 9/2019 | Ramones et al. | |
| 2007/0035929 A1 * | 2/2007 | Hsu | H01L 23/3675 361/704 |
| 2008/0266807 A1 * | 10/2008 | Lakin | H05K 7/20409 361/709 |
| 2009/0040731 A1 * | 2/2009 | Jin | H01L 23/02 361/711 |
| 2013/0182392 A1 * | 7/2013 | Yu | H05K 7/2039 361/719 |
| 2015/0077932 A1 * | 3/2015 | Chai | G06F 1/20 361/679.54 |
| 2017/0290209 A1 * | 10/2017 | Craig | H01L 23/552 |

* cited by examiner

*Primary Examiner* — Hung V Ngo
(74) *Attorney, Agent, or Firm* — Charles E. Baxley

(57) ABSTRACT

An electromagnetic interference shield includes a housing having an opening formed by a peripheral flange, and a base heat sink engaged onto the housing, the base heat sink includes an aperture formed the base heat sink and includes one or more folds for increasing a surface size of the base heat sink, a conductive member is engaged with the peripheral flange of the housing, and the conductive member includes a fastener engaged through the opening of the housing and engaged with the aperture of the base heat sink, and one or more heat sinks are further attached onto the base heat sink for increasing a surface size of the heat sinks.

7 Claims, 3 Drawing Sheets

EMI SHIELD WITH INCREASED HEAT DISSIPATING EFFECT

BACKGROUND OF THE INVENTION

1. Field of the Invention

The present invention relates to an electromagnetic interference (EMI) shield, and more particularly to an electromagnetic interference shield including an improved structure or configuration for allowing the heat dissipating effect of the electromagnetic interference shield to be suitably increased or facilitated.

2. Description of the Prior Art

Various kinds of typical electromagnetic interference (EMI) shields have been developed and provided for dissipating the heat or the thermal energy that may be generated by discrete electrical components, such as semiconductor integrated circuits or other electromagnetic equipments.

For example, many electronic products today include discrete electrical components, such as semiconductor integrated circuits, which generate substantial amounts of thermal energy during normal operation. If the thermal energy is too great without adequate cooling, permanent damage to the electrical component or product may result. In order to prevent such damage, a solution for thermal dissipation or cooling for the electrical component is typically necessary.

Known solutions for thermal dissipation typically include positioning a heat sink over the electrical component that generates the heat or the thermal energy. Heat sinks are generally die cast articles manufactured from a material having a high thermal conductivity, such as aluminum. Heat sinks typically include a base with a series of heat dissipating elements or fins extending vertically upwardly from the base to maximize surface area. Air flow through the heat dissipating elements, with or without the assistance of a mechanical fan, operates to dissipate the thermal energy from the heat sink, and, in turn, from the electrical component.

For example, U.S. Pat. No. 9,368,455 B2 to Mahajan et al., U.S. Pat. No. 9,691,711 B2 to Mahajan et al., U.S. Pat. No. 10,304,621 B2 to Arisari et al., U.S. Pat. No. 10,321,553 B2 to Zhang et al., and U.S. Pat. No. 10,410,948 B2 to Ramones et al. disclose several of the typical electromagnetic interference shields for electronic products or equipments, and each normally comprising a heat sink attached to a shield, and a conductive member attached to the shield with fasteners or the like for suitably dissipating the heat or the thermal energy that may be generated by discrete electrical components, such as semiconductor integrated circuits.

However, the volume or standard or area of the electromagnetic interference shield is limited, and the size or area of the heat sink is also limited and nay not be suitably increased such that the heat dissipating effect of the electromagnetic interference shield is also limited.

The present invention has arisen to mitigate and/or obviate the afore-described disadvantages of the conventional electromagnetic interference shields.

SUMMARY OF THE INVENTION

The primary objective of the present invention is to provide an electromagnetic interference (EMI) shield including an improved structure or configuration for allowing the heat dissipating effect of the electromagnetic interference shield to be suitably increased or facilitated.

In accordance with one aspect of the invention, there is provided an electromagnetic interference shield comprising a housing including an opening formed in the housing and defined by a peripheral flange, a base heat sink engaged onto the housing, the base heat sink including an aperture formed the base heat sink, a conductive member engaged with the peripheral flange of the housing, and the conductive member including a fastener engaged through the opening of the housing and engaged with the aperture of the base heat sink, and another heat sink may further be attached onto the base heat sink for increasing the heat dissipating surface size of the base heat sink.

The conductive member includes a peripheral shoulder formed in the conductive member for engaging with the peripheral flange of the housing and for anchoring the conductive member to the housing, and the conductive member includes a bulge snugly fitted into the opening of the housing.

The base heat sink includes a fold for forming a protrusion and for increasing a surface size of the base heat sink. The second heat sink includes a fold for forming a lower segment, and the lower segment of the second heat sink is attached onto the protrusion of the base heat sink.

A third heat sink may further be provided and attached onto the second heat sink. The third heat sink includes a fold for forming a lower section and for increasing a surface size of the third heat sink. The second heat sink includes an upper segment engaged with the lower section of the third heat sink.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
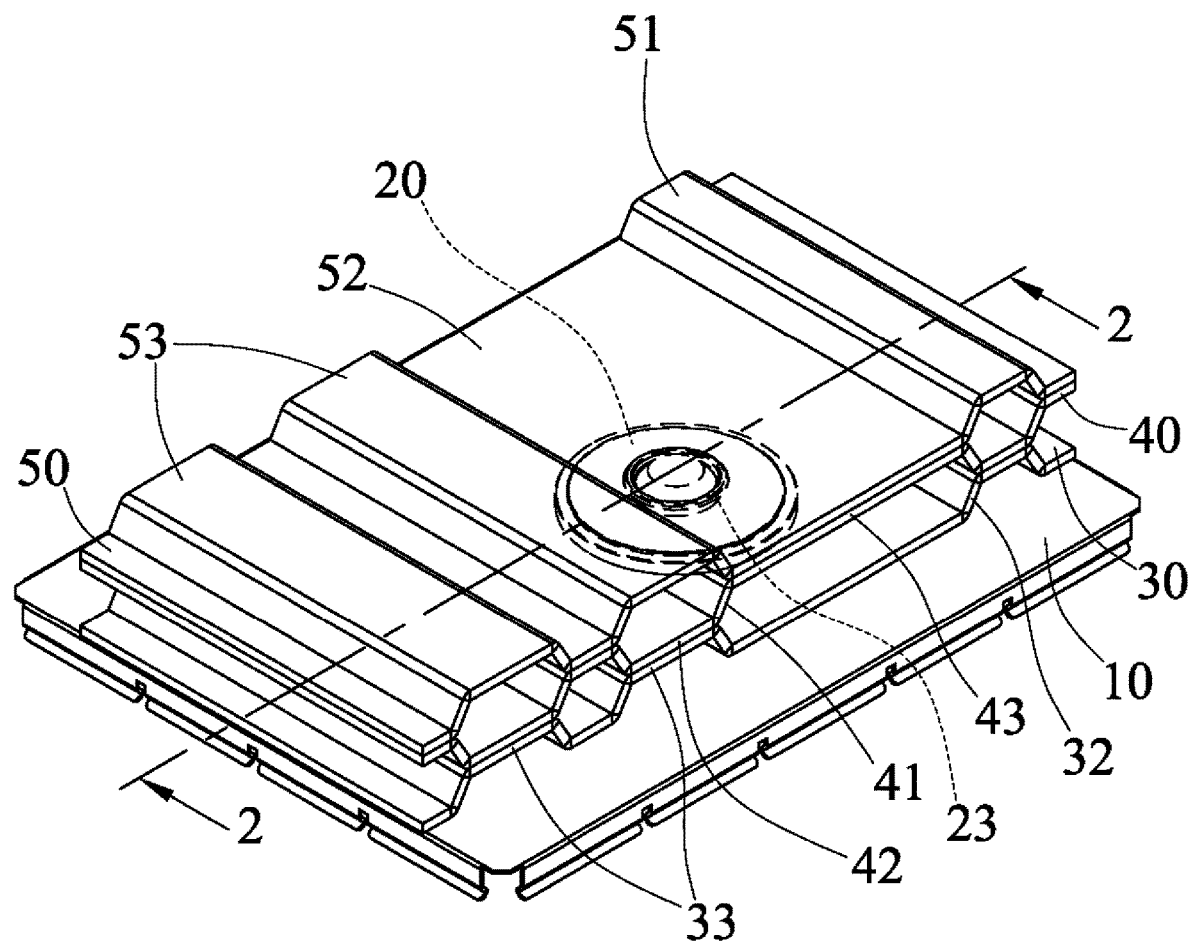
FIG. 1 is a perspective view of an electromagnetic interference shield in accordance with the present invention.
Figure 2:
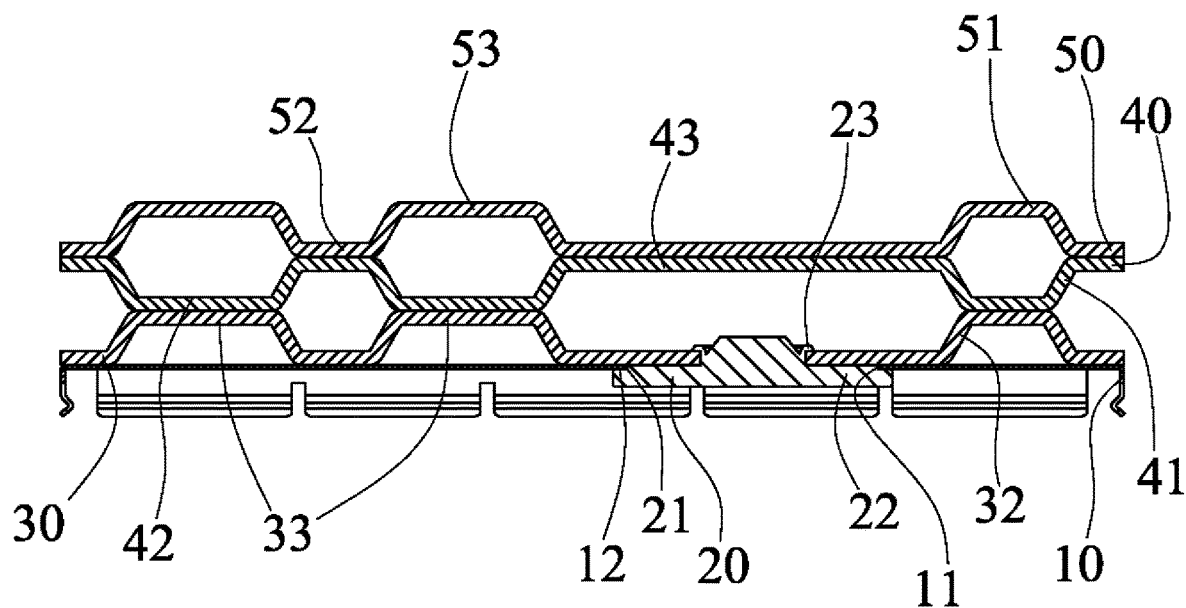
FIG. 2 is a cross sectional view of the electromagnetic interference shield taken along lines 2-2 of FIG. 1.
Figure 5:
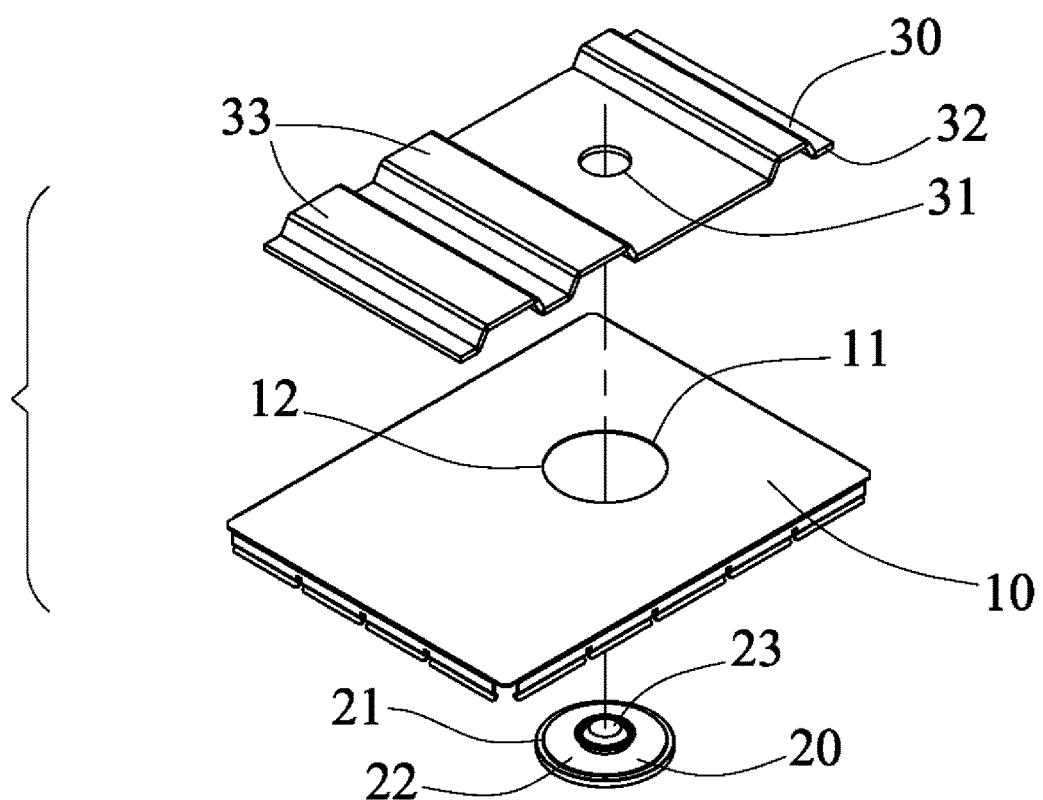
FIG. 5 is a partial exploded view of the electromagnetic interference shield.

Referring to the drawings, and initially to FIGS. 1-2 and 5, an electromagnetic interference (EMI) shield in accordance with the present invention comprises an EMI shield body or housing 10 including an orifice or opening 11 formed therein and formed or defined by a peripheral flange 12, for receiving or engaging with a conductive member 20, the conductive member 20 includes a peripheral shoulder 21 formed therein for engaging with the peripheral flange 12 of the housing 10, and for forming or defining a swelling or bulge 22 thereon and for suitably and snugly fitting into the opening 11 of the housing 10. The conductive member 20 further includes a lock or latch or rivet or fastener 23 formed or provided thereon and extended upwardly into or through the opening 11 of the housing 10.

Figure 4:
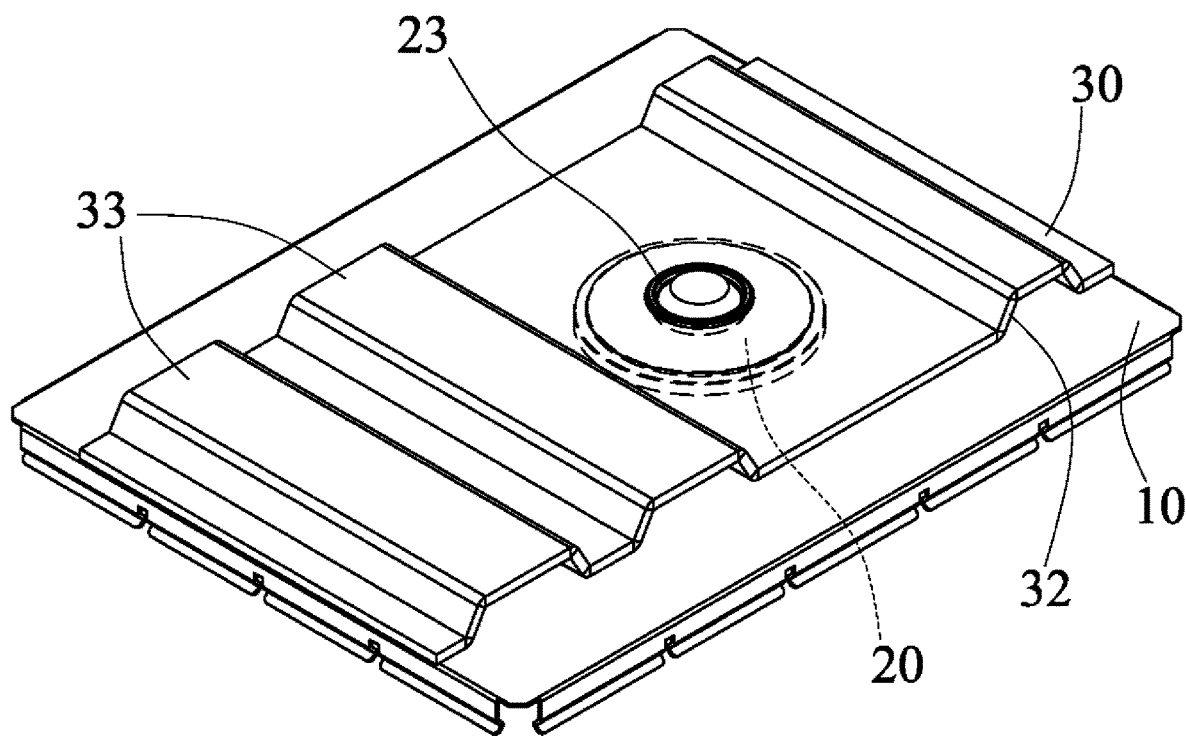
FIG. 4 is a further perspective view similar to FIGS. 1 and 3, illustrating the operation of the electromagnetic interference shield.

A first or base heat dissipating member or heat sink 30 is disposed or attached or engaged onto the housing 10 and includes another orifice or aperture 31 formed therein for engaging with the fastener 23 of the conductive member 20 and for locking or securing or retaining the base heat sink 30 to the housing 10, best shown in FIG. 4. The base heat sink 30 includes one or more folds 32 formed or provided thereon for forming or defining one or more bulges or protrusions 33 thereon and for suitably increasing the surface area or size of the base heat sink 30. It is preferable, but not necessary that the conductive member 20 is made of aluminum, copper, or other conductive materials.

Figure 3:
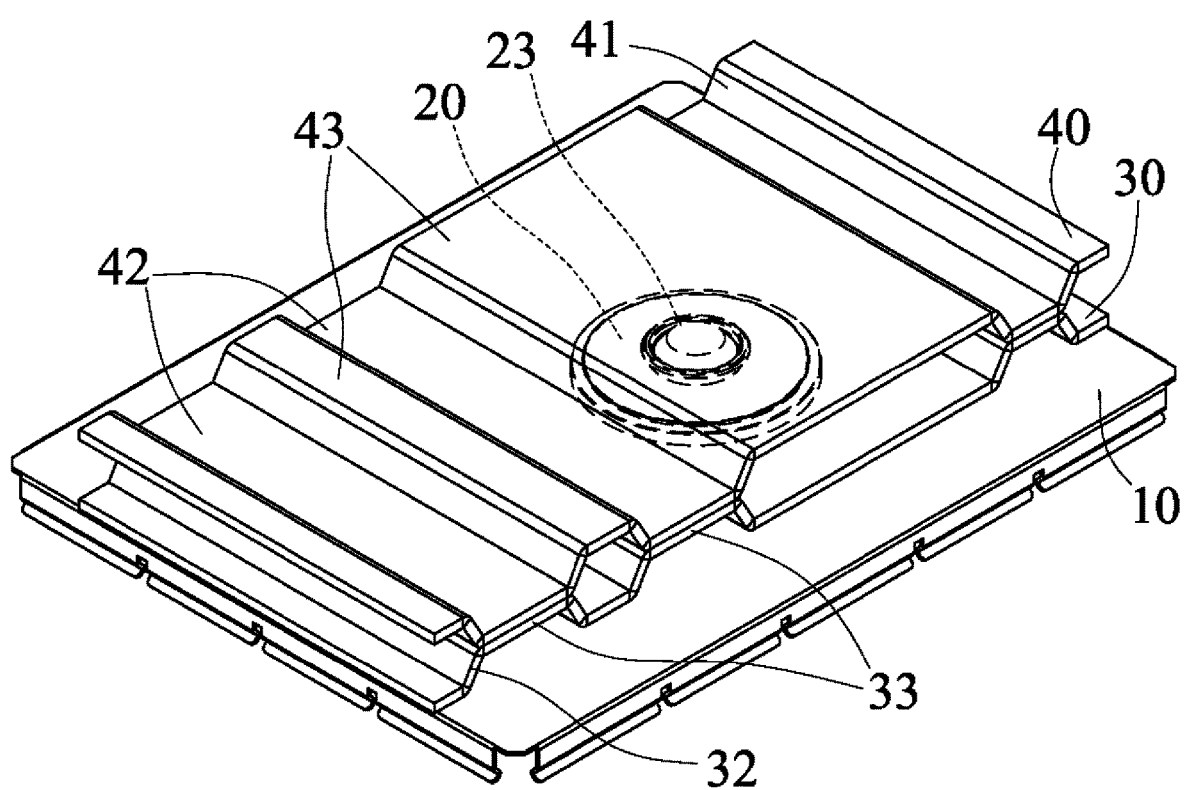
FIG. 3 is another perspective view similar to FIG. 1, illustrating the operation of the electromagnetic interference shield.

As shown in FIGS. 1-3, one or more further heat dissipating members or heat sinks 40, 50, such as the second heat sink 40 and the third heat sink 50 may further be provided and attached or mounted or secured onto the base heat sink 30 for further suitably increasing the surface area or size of the heat sinks 30, 40, 50 and for further suitably increasing the heat dissipating effect of the electromagnetic interference shield. For example, the second heat sink 40 also includes one or more folds 41 formed or provided thereon for forming or defining one or more lower segments 42 and one or more higher segments 43 thereon and for suitably increasing the surface area or size of the second heat sink 40, and the lower segments 42 of the second heat sink 40 may be attached or mounted or secured onto the protrusions 33 of the base heat sink 30 (FIG. 3) with adhesive materials, welders, rivets, screws, bolts, catches, latches or fasteners or the like.

As shown in FIGS. 1 and 2, the third heat sink 50 also includes one or more folds 51 formed or provided thereon for forming or defining one or more lower sections 52 and one or more higher sections 53 thereon and for suitably increasing the surface area or size of the third heat sink 50, and the lower sections 52 of the third heat sink 50 may be attached or mounted or secured onto the higher segments 43 of the second heat sink 40 with adhesive materials, welders, rivets, screws, bolts, catches, latches or fasteners or the like.

Accordingly, the electromagnetic interference shield in accordance with the present invention includes an improved structure or configuration for allowing the heat dissipating effect of the electromagnetic interference shield to be suitably increased or facilitated.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

We claim:

1. An electromagnetic interference shield comprising:
a housing including an opening formed in said housing and defined by a peripheral flange,
a base heat sink engaged onto said housing, said base heat sink including an aperture formed said base heat sink,
a conductive member engaged with said peripheral flange of said housing, and said conductive member including a fastener engaged through said opening of said housing and engaged with said aperture of said base heat sink, and
a second heat sink attached onto said base heat sink.

2. The electromagnetic interference shield as claimed in claim 1, wherein said conductive member includes a peripheral shoulder formed in said conductive member for engaging with said peripheral flange of said housing, and said conductive member includes a bulge snugly fitted into said opening of said housing.

3. The electromagnetic interference shield as claimed in claim 1, wherein said base heat sink includes a fold for forming a protrusion and for increasing a surface size of said base heat sink.

4. The electromagnetic interference shield as claimed in claim 3, wherein said second heat sink includes a fold for forming a lower segment and for increasing a surface size of said second heat sink, said lower segment of said second heat sink is attached onto said protrusion of said base heat sink.

5. The electromagnetic interference shield as claimed in claim 3 further comprising a third heat sink attached onto said second heat sink.

6. The electromagnetic interference shield as claimed in claim 5, wherein said third heat sink includes a fold for forming a lower section and for increasing a surface size of said third heat sink.

7. The electromagnetic interference shield as claimed in claim 6, wherein said second heat sink includes an upper segment engaged with said lower section of said third heat sink.

* * * * *